United States Patent
Hatakeyama et al.

(10) Patent No.: US 10,056,878 B2
(45) Date of Patent: Aug. 21, 2018

(54) ACOUSTIC WAVE DEVICE AND METHOD OF FABRICATING THE SAME

(71) Applicant: TAIYO YUDEN CO., LTD., Tokyo (JP)

(72) Inventors: Kazushige Hatakeyama, Tokyo (JP); Hitoshi Tsukidate, Tokyo (JP); Atsushi Kawasaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 117 days.

(21) Appl. No.: 14/945,129

(22) Filed: Nov. 18, 2015

(65) Prior Publication Data

US 2016/0173060 A1 Jun. 16, 2016

(30) Foreign Application Priority Data

Dec. 12, 2014 (JP) .................................. 2014-252114
Apr. 27, 2015 (JP) .................................. 2015-090682

(51) Int. Cl.
*H03H 9/64* (2006.01)
*H03H 9/60* (2006.01)
(Continued)

(52) U.S. Cl.
CPC .... *H03H 9/02992* (2013.01); *H03H 9/02921* (2013.01); *H03H 9/02952* (2013.01);
(Continued)

(58) Field of Classification Search
CPC ........... H03H 9/02897; H03H 9/02921; H03H 9/02952; H03H 9/02992; H03H 9/059;
(Continued)

(56) References Cited

U.S. PATENT DOCUMENTS 7,116,187 B2 * 10/2006 Inoue ................... H03H 9/0576
333/133
7,477,117 B2 * 1/2009 Pitschi ................. H03H 9/0057
310/313 A (Continued)

FOREIGN PATENT DOCUMENTS

DE  10 2008 020 783 A1 * 10/2009
JP      07-212175 A     * 8/1995
(Continued)

OTHER PUBLICATIONS

English language machine translation of JP 2002-319834 A, published on Oct. 31, 2002, 5 pages.*
(Continued)

*Primary Examiner* — Barbara Summons
(74) *Attorney, Agent, or Firm* — Chen Yoshimura LLP

(57) ABSTRACT

An acoustic wave device includes: a substrate; a first acoustic wave resonator and a second acoustic wave resonator located on the substrate; a first wiring line electrically coupled to the first acoustic wave resonator, located on the substrate, and located between the first acoustic wave resonator and the second acoustic wave resonator; and a second wiring line electrically coupled to the second acoustic wave resonator, located on the substrate, located between the first acoustic wave resonator and the second acoustic wave resonator, having an electric potential different from an electric potential of the first wiring line, and having a thickness greater than a thickness of the first wiring line.

6 Claims, 15 Drawing Sheets

(51) Int. Cl.
*H03H 9/02* (2006.01)
*H03H 9/72* (2006.01)
*H03H 3/08* (2006.01)

(52) U.S. Cl.
CPC .......... *H03H 9/6483* (2013.01); *H03H 9/725* (2013.01); *H03H 3/08* (2013.01)

(58) Field of Classification Search
CPC ...... H03H 9/64; H03H 9/6483; H03H 9/6489; H03H 9/725
USPC ............. 333/189, 193, 195, 133; 310/313 R, 310/313 B, 313 D, 363–365
See application file for complete search history.

(56) References Cited

U.S. PATENT DOCUMENTS

| | | | |
|---|---|---|---|
| 8,222,972 B2* | 7/2012 | Inoue | H03H 9/0222 333/133 |
| 8,339,217 B2* | 12/2012 | Kawamoto | H03H 9/6483 333/133 |
| 2002/0057034 A1 | 5/2002 | Ishikawa et al. | |
| 2003/0062969 A1 | 4/2003 | Inoue | |
| 2004/0090288 A1 | 5/2004 | Inoue | |
| 2011/0001578 A1* | 1/2011 | Jibu | H03H 9/02992 333/133 |
| 2012/0319802 A1* | 12/2012 | Ochiai | H03H 9/1092 333/193 |

FOREIGN PATENT DOCUMENTS

| | | | |
|---|---|---|---|
| JP | 2000-114916 A | | 4/2000 |
| JP | 2002-319834 A | * | 10/2002 |
| JP | 2003-101373 A | | 4/2003 |
| JP | 2003-174056 A | | 6/2003 |
| JP | 2008-235979 A | * | 10/2008 |
| JP | 2010-252321 A | * | 11/2010 |

OTHER PUBLICATIONS

English language machine translation of JP 2010-252321 A, published Nov. 4, 2010, 7 pages.*

* cited by examiner

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2014-252114, filed on Dec. 12, 2014, and the prior Japanese Patent Application No. 2015-090682, filed on Apr. 27, 2015, the entire contents of which are incorporated herein by reference.

FIELD

A certain aspect of the present invention relates to an acoustic wave device and a method of fabricating the same.

BACKGROUND

Acoustic wave devices are employed in filters for mobile communications. The acoustic wave device includes acoustic wave resonators formed on a substrate. Wiring lines formed between the acoustic wave resonators are sometimes formed adjacent to each other as disclosed in Japanese Patent Application Publication No. 2000-114916. There has been known forming a wiring line connecting acoustic wave elements formed on a substrate or a wiring line connecting an acoustic wave element to an external terminal by liftoff as disclosed in Japanese Patent Application Publication Nos. 2003-101373 and 2003-174056.

SUMMARY OF THE INVENTION

According to an aspect of the present invention, there is provided an acoustic wave device including: a substrate; an electrode of an acoustic wave element formed on the substrate; a seed layer formed on the electrode so as to be electrically coupled to the electrode; and a plated layer formed on the seed layer, wherein the seed layer protrudes horizontally further out than the plated layer.

According to another aspect of the present invention, there is provided an acoustic wave device including: a substrate; a first acoustic wave resonator and a second acoustic wave resonator located on the substrate; a first wiring line electrically coupled to the first acoustic wave resonator, located on the substrate, and located between the first acoustic wave resonator and the second acoustic wave resonator; and a second wiring line electrically coupled to the second acoustic wave resonator, located on the substrate, located between the first acoustic wave resonator and the second acoustic wave resonator, having an electric potential different from an electric potential of the first wiring line, and having a thickness greater than a thickness of the first wiring line.

According to another aspect of the present invention, there is provided a method of fabricating an acoustic wave device, the method including: forming an electrode of an acoustic wave element on a substrate; forming a first mask layer on the substrate, the first mask layer having a first aperture to which a part of the electrode is exposed; forming a seed layer on the substrate so that the seed layer makes contact with the electrode in the first aperture and covers the first mask layer; forming a second mask layer on the seed layer, the second mask layer having a second aperture overlapping the first aperture; forming a plated layer on the seed layer in the second aperture by supplying electrical current from the seed layer; and removing the first mask layer and the second mask layer to liftoff the seed layer other than the seed layer in the first aperture.

DETAILED DESCRIPTION

To improve electrical characteristics, a wiring line is preferably thick. However, when the wiring line is formed by liftoff, it is difficult to make the wiring line thick. On the other hand, when the wiring line is formed by plating, acoustic wave elements are damaged. Additionally, to reduce the size of the acoustic wave device, a distance between the adjacent wiring lines may be reduced. However, when the distance between the wiring lines having different electric potentials is reduced, parasitic capacitance is generated between the wiring lines, and characteristics of the acoustic wave device deteriorate. Additionally, the stress of the wiring line may cause short circuit of the wiring line. Furthermore, discharge between the wiring lines may cause electrostatic discharge failure. As described above, it is difficult to reduce the distance between the wiring lines.

A description will now be given of embodiments of the present invention with reference to the drawings.

First Embodiment

Figure 1:
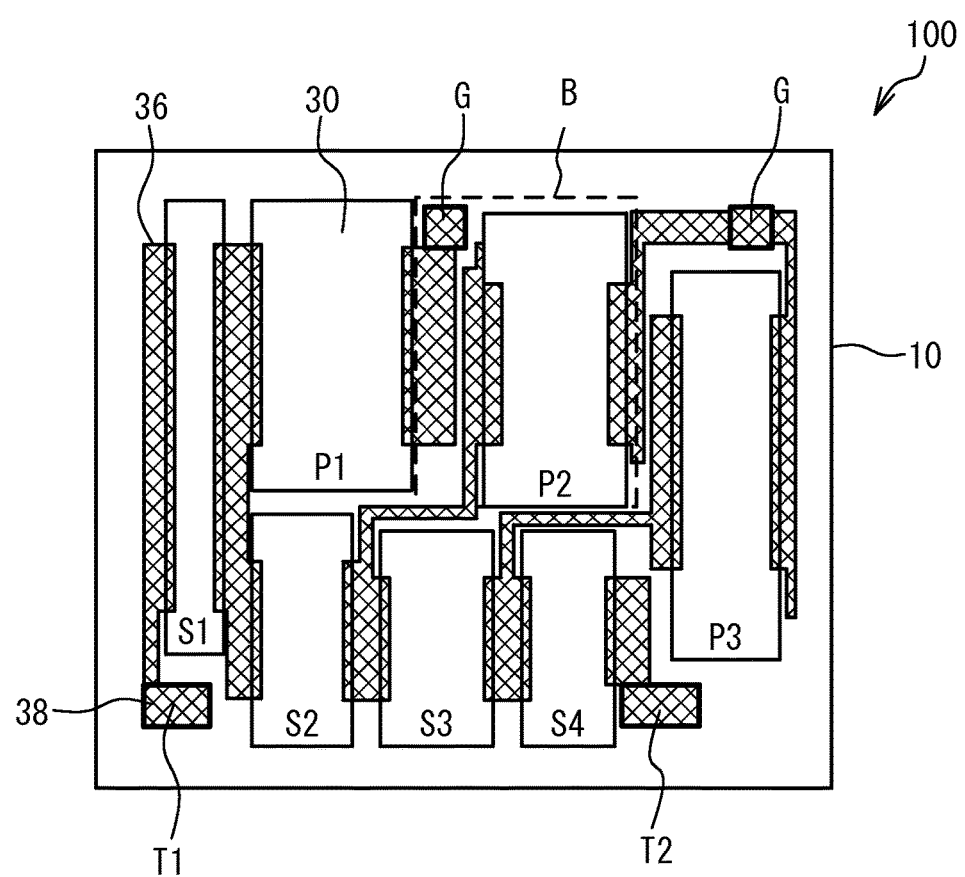
FIG. 1 is a plan view of an acoustic wave device in accordance with a first embodiment.

A first embodiment uses a surface acoustic wave element as an acoustic wave element. FIG. 1 is a plan view of an acoustic wave device in accordance with the first embodiment. As illustrated in FIG. 1, acoustic wave elements 30 are formed on a substrate 10. Wiring lines 36 are formed between the acoustic wave elements 30 and between the acoustic wave elements 30 and external terminal pads 38. The acoustic wave elements 30 are series resonators S1 through S4 and parallel resonators P1 through P3. The pads 38 are signal terminals T1 and T2, and ground terminals G. Between the signal terminals T1 and T2, the series resonators S1 through S4 are connected in series through the wiring lines 36, and the parallel resonator P1 through P3 are connected in parallel. Thus, an acoustic wave device 100 functions as a ladder-type filter.

Figure 2:
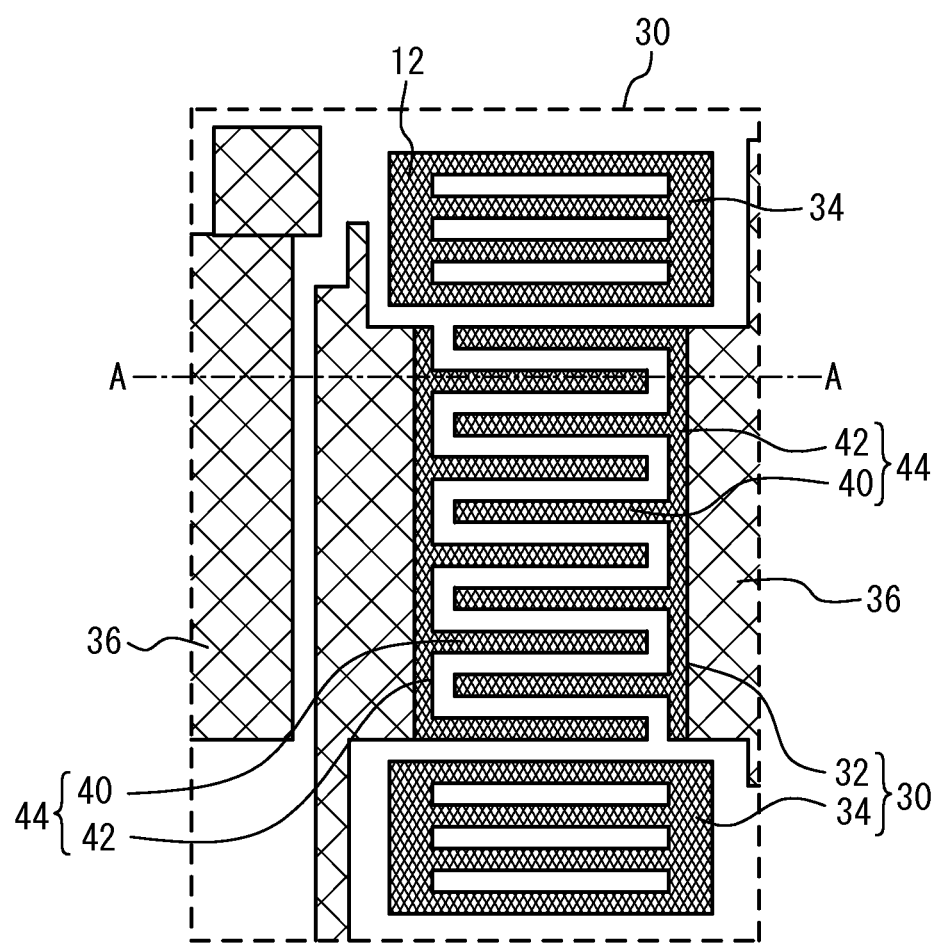
FIG. 2 is an enlarged view of a region B in FIG. 1.

FIG. 2 is an enlarged view of a region B in FIG. 1. As illustrated in FIG. 2, the acoustic wave element 30 includes an Interdigital Transducer (IDT) 32 and reflectors 34. The reflectors 34 are formed at both sides of the IDT 32 in the propagation direction of the acoustic wave. The IDT 32 includes a pair of comb-shaped electrodes 44 facing each other. The comb-shaped electrode 44 includes electrode fingers 40 and a bus bar 42. The electrode fingers 40 are connected to the bus bar 42. The wiring lines 36 are electrically connected to the bus bars 42.

Figure 3A:
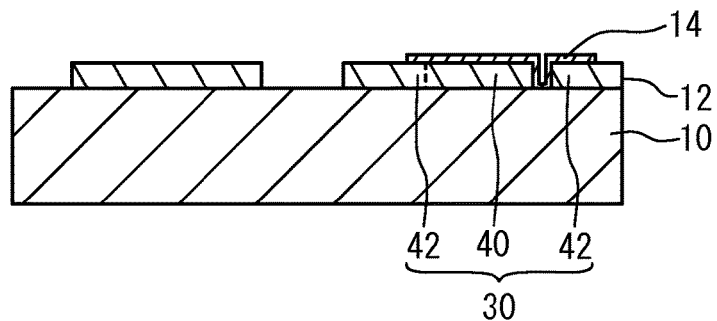
FIG. 3A through FIG. 3D are cross-sectional views illustrating a method of fabricating the acoustic wave device of the first embodiment (No. 1)

FIG. 3A through FIG. 4C are cross-sectional views illustrating a method of fabricating the acoustic wave device of the first embodiment. FIG. 5A and FIG. 5B are enlarged views of a region C in FIG. 3D and FIG. 4C, respectively. As illustrated in FIG. 3A, a metal film 12 is formed on the substrate 10. The substrate 10 is, for example, a piezoelectric substrate such as a lithium tantalate ($LiTaO_3$) substrate or a lithium niobate ($LiNbO_3$) substrate. The metal film 12 is, for example, an aluminum film. The metal film 12 is formed by, for example, sputtering and etching. The metal film 12 forms the acoustic wave element 30 including the electrode fingers 40 and the bus bar 42. The metal film 12 has a film thickness of, for example, 150 to 400 nm. The metal film 12 may be a copper film. A protective film 14 is formed on the acoustic wave element 30. The protective film 14 is, for example, a silicon oxide film with a film thickness of 20 nm. The protective film 14 is formed by, for example, sputtering and etching.

Figure 3B:
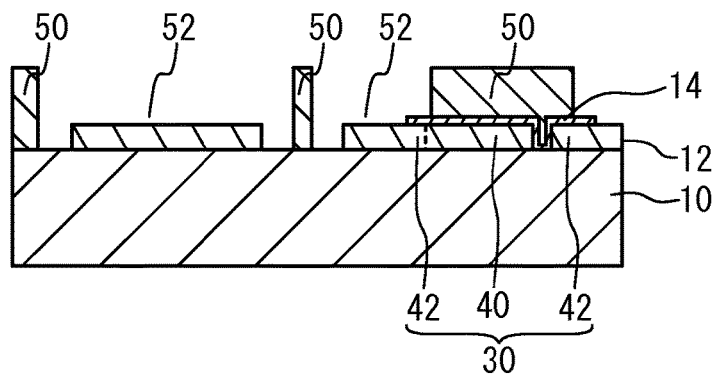

As illustrated in FIG. 3B, a mask layer 50 is formed on the substrate 10 so that apertures 52 are formed in regions where wiring lines are formed. The aperture 52 is formed in a part of the bus bar 42. The mask layer 50 has a heat resistance withstanding the temperature during bake conducted later, and is, for example, a photoresist film with a film thickness of 2 μm or greater. The mask layer 50 is formed by, for example, photolithography.

Figure 3C:
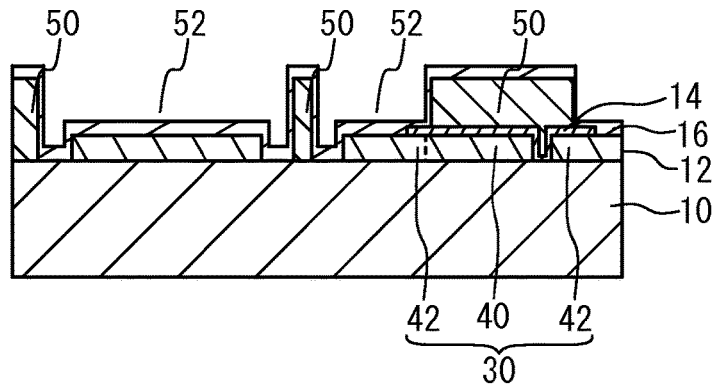

As illustrated in FIG. 3C, a seed layer 16 is formed across the entire surface on the substrate 10 to cover the mask layer 50. The seed layer 16 is, for example, a titanium film with a film thickness of 0.2 μm and a gold film with a film thickness of 0.15 μm stacked in this order from the substrate 10 side. The seed layer 16 is formed by, for example, evaporation. The seed layer 16 may be a titanium film with a film thickness of 0.1 μm and a copper film with a film thickness of 0.3 μm stacked in this order from the substrate 10 side. The seed layer 16 may be formed by sputtering, but is preferably formed by evaporation because liftoff is conducted. The film at the substrate 10 side of the seed layer 16 is an adhesion film improving the adhesiveness to the metal film 12. When the metal film 12 is an aluminum film, the adhesion film is, for example, a titanium film. The upper film of the seed layer 16 functions as a seed for plating, and is preferably made of a material same as that of the plated layer.

Figure 3D:
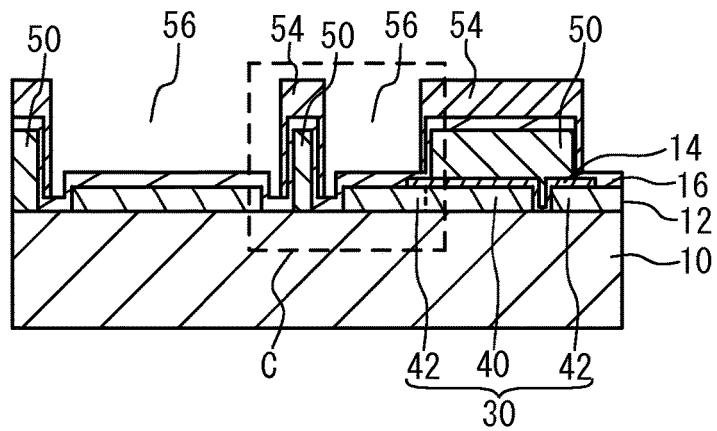

As illustrated in FIG. 3D, a mask layer 54 is formed on the seed layer 16 so that apertures 56 are formed in regions where the wiring lines are formed. The mask layer 54 is, for example, a photoresist film with a film thickness of 7 μm. The mask layer 54 is formed by, for example, photolithography. The aperture 56 is formed so that the aperture 56 is smaller than the aperture 52 and included in the aperture 52.

As illustrated in FIG. 5A, the mask layer 54 is formed to cover the lateral side of the mask layer 50. A distance L1 between the seed layer 16 formed on the side surface of the mask layer 50 and the side surface of the mask layer 54 is, for example, approximately 0.5 to 2 μm. The mask layer 54 has a film thickness that allows the mask layer 54 to cover the side surface of the seed layer 16.

Figure 4A:
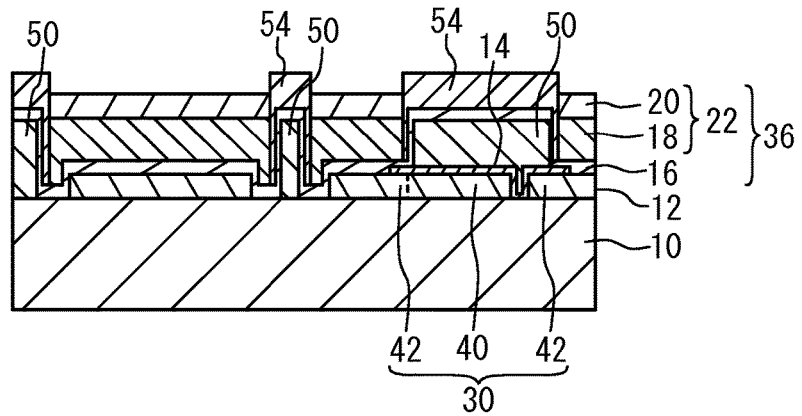
FIG. 4A through FIG. 4C are cross-sectional views illustrating the method of fabricating the acoustic wave device of the first embodiment (No. 2)
Figure 5A:
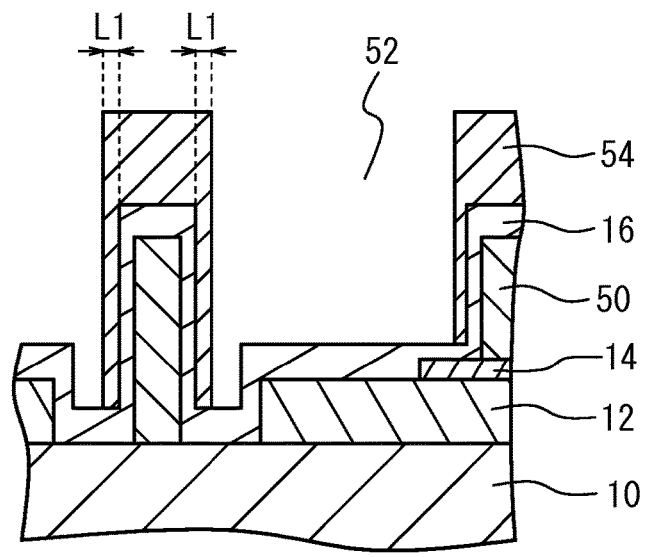
FIG. 5A and FIG. 5B are enlarged views of a region C in FIG. 3D and FIG. 4C, respectively.
Figure 5B:
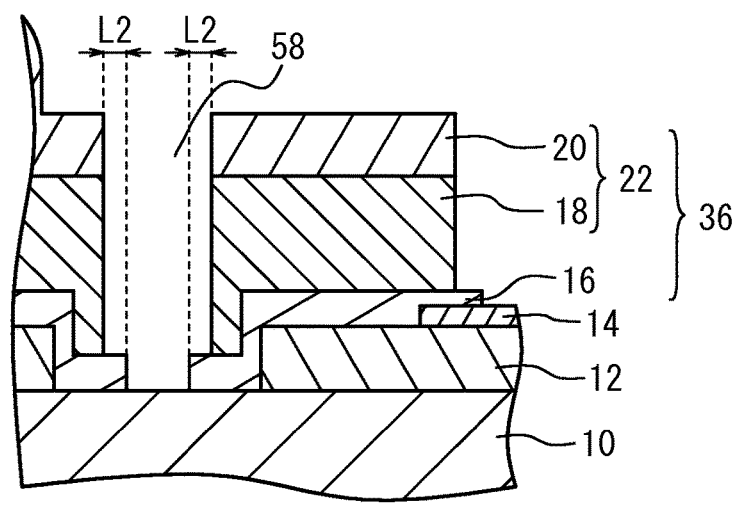

As illustrated in FIG. 4A, a plated layer 22 is formed in the apertures 56. The plated layer 22 includes a lower layer 18, a barrier layer (not illustrated), and an upper layer 20 in this order from the substrate side. The lower layer 18 is, for example, a copper layer with a film thickness of 3 μm. The barrier layer is, for example, a palladium layer with a film thickness of 0.3 μm. The upper layer 20 is, for example, a gold layer with a film thickness of 1 μm. The plated layer 22 is formed by electrolytic plating with supplying electrical current from the seed layer 16. The lower layer 18 is preferably made of a non-magnetic material of low electric resistivity capable of being thickened. Thus, the lower layer 18 is preferably a copper layer or a gold layer. The lower layer 18 preferably has a film thickness of 1 μm or greater to reduce the resistance of the wiring line 36. When stud bumps are formed on the plated layer 22, the upper layer 20 is preferably a gold layer. The barrier layer prevents the interdiffusion between the lower layer 18 and the upper layer 20 due to heating or aging. When the lower layer 18 is a copper layer and the upper layer 20 is a gold layer, the barrier layer is preferably a palladium layer or a nickel layer with a film thickness of 0.2 μm. The upper layer 20 may be formed by electroless plating. In this case, the upper layer 20 has a film thickness of, for example, 0.4 μm. Alternatively, the barrier layer and the upper layer 20 may be formed by evaporation. In this case, the barrier layer is, for example, a titanium layer with a film thickness of 0.2 μm, and the upper layer 20 is a gold layer with a film thickness of 0.4 μm.

Figure 4B:
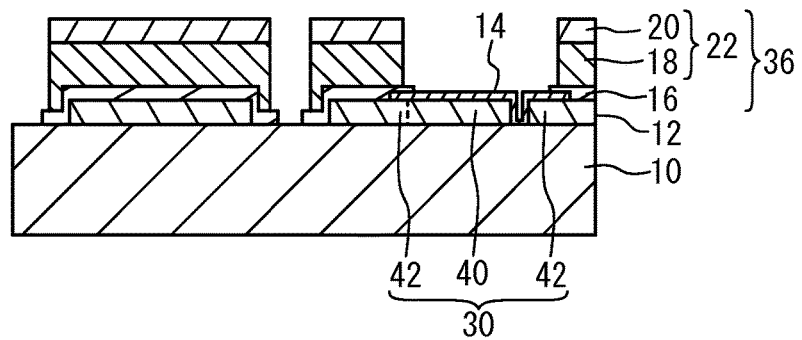

As illustrated in FIG. 4B, the mask layers 50 and 54 are removed with, for example, an organic solvent. At this time, the seed layer 16 formed between the mask layers 50 and 54 is liftoff. To liftoff the seed layer 16, the organic solvent may be jetted with high pressure. Alternatively, ultrasonic cleaning in the organic solvent may be performed. When the distance L1 in FIG. 5A is not properly secured, the seed layer 16 formed on the side surface of the mask layer 50 may remain on the side surface of the plated layer 22.

Figure 4C:
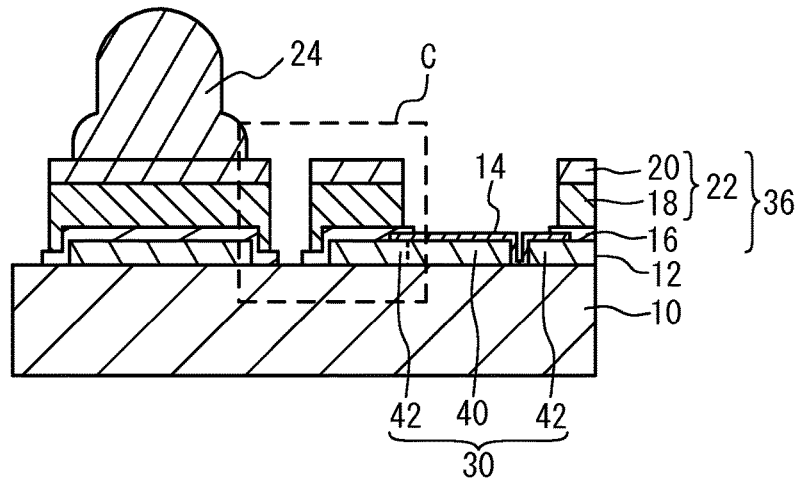

As illustrated in FIG. 4C, a bump 24 such as a stud bump is formed on the plated layer 22 of the pad. As illustrated in FIG. 5B, the seed layer 16 protrudes further out than the plated layer 22 by a distance L2. The distance L2 is approximately equal to the distance L1.

According to the first embodiment, the metal film 12 including an IDT is formed on the substrate 10 as illustrated in FIG. 3A. As illustrated in FIG. 3B, the mask layer 50 (first mask layer) having the aperture 52 (first aperture) to which at least a part of the metal film 12 is exposed is formed. As illustrated in FIG. 3C, the seed layer 16 is formed on the substrate 10 to make contact with an electrode made of the metal film 12 in the aperture 52 and cover the mask layer 50. As illustrated in FIG. 3D, the mask layer 54 (second mask layer) having the aperture 56 (second aperture) overlapping the aperture 52 is formed on the seed layer 16. As illustrated in FIG. 4A, the plated layer 22 is formed on the seed layer 16 in the aperture 56 by supplying electric current from the seed layer 16. As illustrated in FIG. 4B, the mask layer 50 and the mask layer 54 are removed to liftoff the seed layer 16 except the seed layer 16 in the aperture 52. This process allows the plated layer 22 to form the wiring line 36.

To improve electrical characteristics of the acoustic wave device 100, the wiring line 36 is preferably thickened, and the resistance of the wiring line 36 is preferably reduced. When the wiring line 36 is formed by evaporation and liftoff, the wiring line 36 cannot be thickened. Thus, the resistance of the wiring line 36 cannot be reduced. When the wiring line 36 is formed by plating, the wiring line 36 can be thickened. When the wiring line 36 is formed by plating, electrical current for electrolytic plating is supplied through the seed layer 16. The seed layer 16 is removed after the formation of the plated layer 22. If the seed layer 16 is removed by etching, the surface of the metal film 12 such as IDTs and/or the wiring line 36 is exposed to etching gas or an etching liquid. Thus, the metal film 12 and/or the wiring line 36 is damaged.

The first embodiment forms the plated layer 22, and then removes the seed layer 16 except the seed layer 16 under the plated layer 22 by liftoff. Thus, the damage to the metal film 12 and/or the wiring line 36 is reduced.

When the mask layer 54 is formed, the aperture 56 smaller than the aperture 52 is formed so that the mask layer 54 covers the side surface of the seed layer 16 formed on the side surface of the mask layer 50 in the aperture 52. Accordingly, as illustrated in FIG. 5A, the mask layer 54 covers the seed layer 16 formed on the side surface of the mask layer 50, preventing the adherence of the seed layer 16 to the plated layer 22 during liftoff. The acoustic wave device fabricated through the above process has the seed layer 16 horizontally protruding further out than the plated layer 22 as illustrated in FIG. 5B.

Second Embodiment

Figure 6:
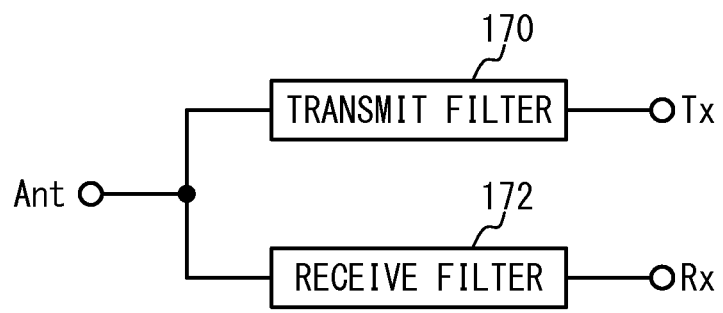
FIG. 6 is a circuit diagram of a duplexer using an acoustic wave device in accordance with a second embodiment.

A second embodiment is an exemplary transmit filter as an acoustic wave device. FIG. 6 is a circuit diagram of a duplexer using an acoustic wave device in accordance with the second embodiment. As illustrated in FIG. 6, a transmit filter 170 is connected between an antenna terminal Ant and a transmit terminal Tx, and a receive filter 172 is connected between the antenna terminal Ant and a receive terminal Rx. The transmit filter 170 outputs signals in the transmit band to the antenna terminal Ant among signals input from the transmit terminal Tx. The receive filter 172 outputs signals in the receive band to the receive terminal Rx among signals input to the antenna terminal Ant.

Figure 7:
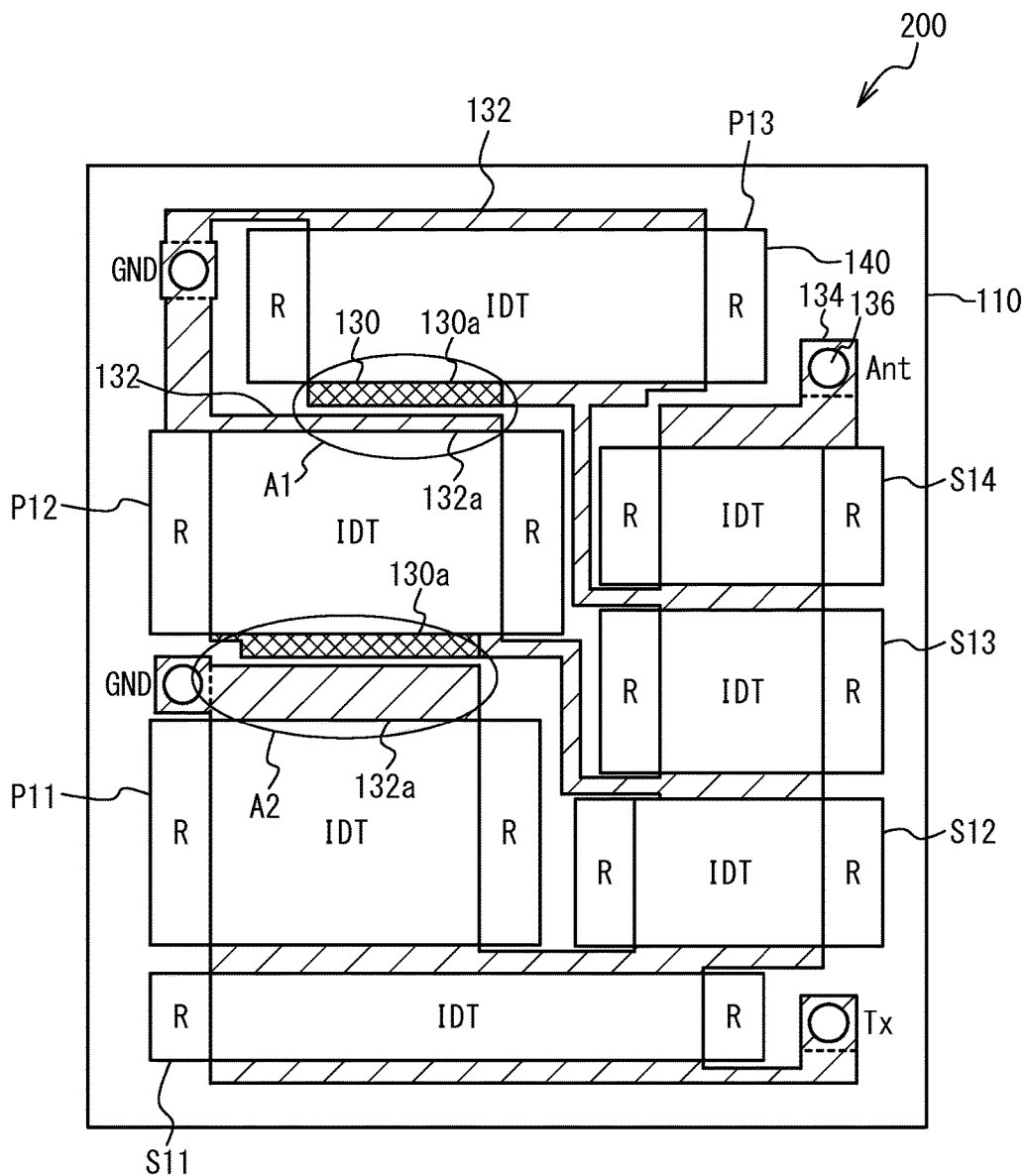
FIG. 7 is a plan view of the acoustic wave device in accordance with the second embodiment.

FIG. 7 is a plan view of the acoustic wave device of the second embodiment. As illustrated in FIG. 7, a transmit filter 200 includes acoustic wave resonators 140, wiring lines 130, 132, and pads 134 formed on a substrate 110. The substrate 110 is, for example, a piezoelectric substrate such as a LiTaO$_3$ substrate or a LiNbO$_3$ substrate. The substrate 110 may be a substrate formed by bonding a piezoelectric substrate to a support substrate such as a sapphire substrate. The acoustic wave resonator 140 is, for example, a surface acoustic wave resonator. The acoustic wave resonator 140 is a one-port resonator, and includes an Interdigital Transducer (IDT) and reflectors R located at both sides of the IDT. The wiring lines 130, 132 and the pads 134 are formed of a metal film such as a copper film or a gold film formed on the substrate 110. The wiring lines 130 and 132 interconnect the acoustic wave resonators 140 and connect the acoustic wave resonators 140 to the pads 134. The wiring line 132 is thicker than the wiring line 130. The pad 134 has the same layer structure and the same thickness as the wiring line 132. A bump 136 is formed on the pad 134. The bump 136 is, for example, a gold bump or a copper bump, and is, for example, a stud bump or a plated bump.

The transmit filter 200 is a ladder-type filter. Series resonators S11 through S14 are connected in series between the pad 134 of the antenna terminal Ant (output terminal) and the pad 134 of the transmit terminal Tx (input terminal). Parallel resonators P11 through P13 are connected in parallel between the antenna terminal Ant and the transmit terminal Tx. First ends of the parallel resonators P11 through P13 are connected to the pads 134 of ground terminals GND.

Figure 8:
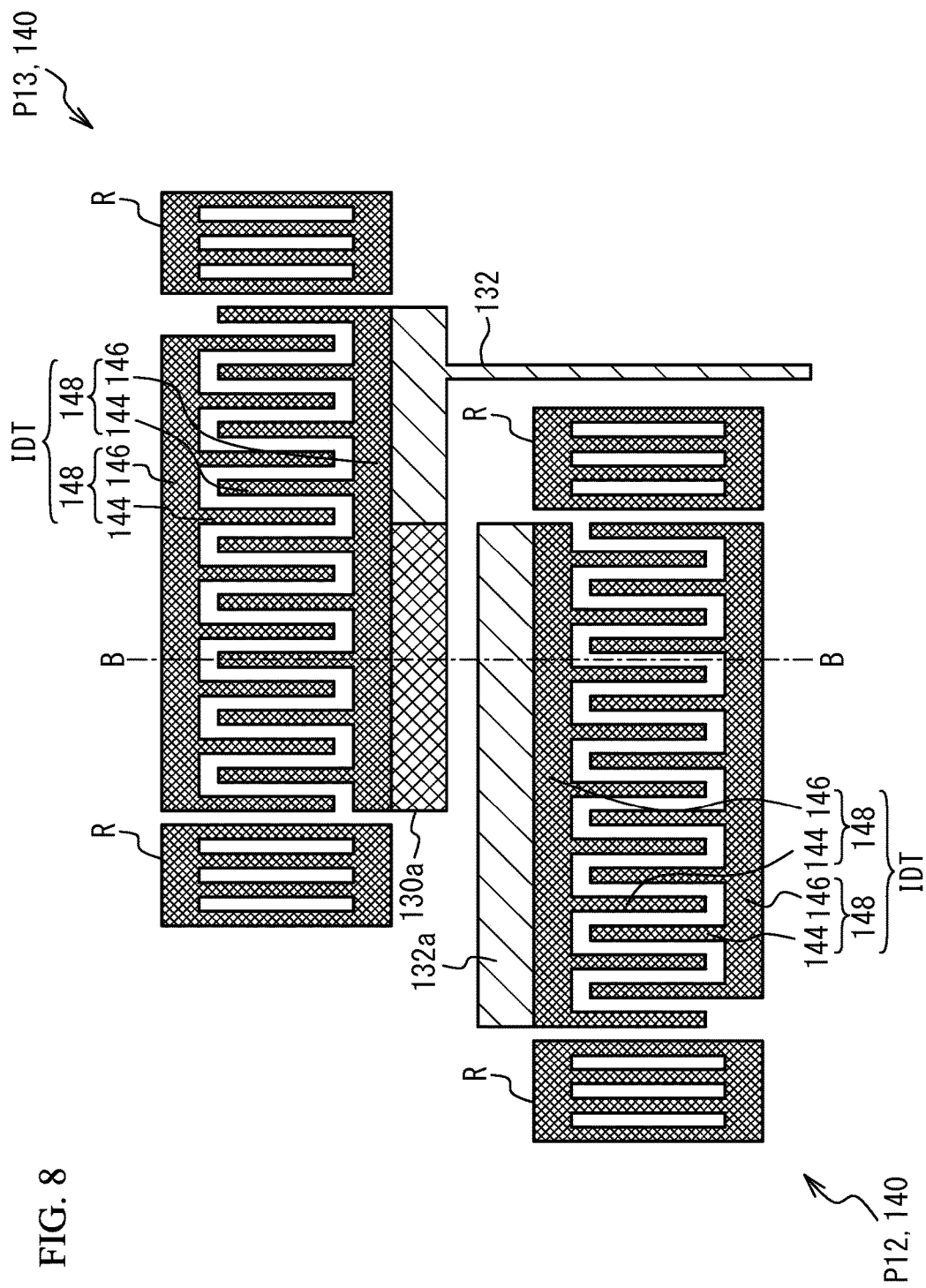
FIG. 8 is an enlarged view around a region A1 in FIG. 7.

FIG. 8 is an enlarged view around a region A1 in FIG. 7. As illustrated in FIG. 8, the acoustic wave resonator 140 includes an IDT and reflectors R formed at both sides of the IDT. The IDT includes a pair of comb-shaped electrodes 148. The comb-shaped electrode 148 includes electrode fingers 144 and a bus bar 146 connecting to the electrode fingers 144. The comb-shaped electrodes 148 face each other so that the electrode fingers 144 are arranged in substantially alternate order. Wiring lines 130a (first wiring line) and 132a (second wiring line) are electrically coupled to the bus bar 146.

Figure 9:
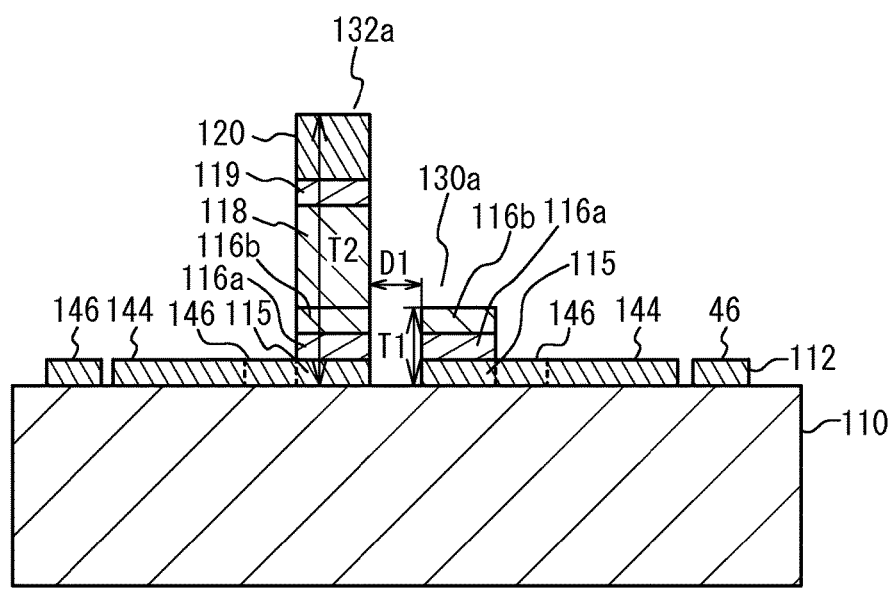
FIG. 9 is a cross-sectional view taken along line B-B in FIG. 8.

FIG. 9 is a cross-sectional view taken along line B-B in FIG. 8. As illustrated in FIG. 9, the electrode fingers 144, the bus bars 146, and lowermost layers 115 of the wiring lines 130a and 132a are formed of a metal film 112. The metal film 112 is, for example, an aluminum film, a titanium film, or a copper film. The wiring line 130a includes the lowermost layer 115, a barrier layer 116a, and a seed layer 116b. The wiring line 132a includes the lowermost layer 115, the barrier layer 116a, the seed layer 116b, a lower layer 118, a barrier layer 119, and an upper layer 120. The barrier layer 116a is a titanium layer, the seed layer 116b is a copper layer, the lower layer 118 is a copper layer, the barrier layer 119 is a palladium layer, and the upper layer 120 is a gold layer, for example. For example, the wiring line 132a may not include the barrier layer 119 or the upper layer 120. The wiring line 132a may include the upper layer 120, but may not include the barrier layer 119.

The wiring lines 130a and 132a may be made of a single layer film or a multilayered film. The layer mainly functioning as the wiring lines 130a and 132a (e.g., the seed layer 116b, the lower layer 118, and the upper layer 120) is preferably a gold layer, a copper layer, or an aluminum layer having a low electrical resistance, or a composite layer of them. When the multiple layers with different materials are included, a barrier layer is preferably located between the films of different materials to prevent the interdiffusion of atoms. The occurrence of the interdiffusion decreases the strength, or increases the resistance. The barrier layer is, for example, a nickel layer, a titanium layer, or a palladium layer. The barrier layer has a film thickness of 0.05 to 2 μm to prevent the diffusion. The wiring line 130a has a film thickness T1 of, for example, 0.1 to 0.5 μm. The wiring line 132a has a film thickness T2 of, for example, 1 to 10 μm. A distance D1 between the wiring lines 130a and 132a is, for example, 5 to 20 μm. Each layer of the wiring lines 130a and 132a is formed by, plating, evaporation, or sputtering. The substrate 10 has an area of, for example, 0.3 to 1.5 mm$^2$, and a thickness of, for example, 1 to 500 μm.

As observed in the region A1 illustrated in FIG. 7, between the parallel resonators P12 and P13, the wiring line 132a electrically coupled to the parallel resonator P12 is adjacent to the wiring line 130a electrically coupled to the parallel resonator P13. As observed in a region A2, between the parallel resonators P11 and P12, the wiring line 132a electrically coupled to the parallel resonator P11 is adjacent to the wiring line 130a electrically coupled to the parallel resonator P12. The wiring line 132a is supplied with ground potential, and the wiring line 130a is supplied with a potential different from the ground potential.

When both the adjacent wiring lines are the thick wiring lines 132 and the distance between the wiring lines 132 is reduced, parasitic capacitance is generated between the wiring lines, and characteristics (e.g., insertion loss) of the acoustic wave device deteriorate. Additionally, the stress of the wiring line 132 may cause short circuit of the wiring line 132. Furthermore, discharge between the wiring lines 132 may cause electrostatic discharge failure. Accordingly, it is difficult to reduce the distance between the wiring lines 132.

The second embodiment makes the wiring line 132a of the adjacent wiring lines 130a and 132a having different electric potentials thicker than the wiring line 130a in the regions A1 and A2 where the wiring lines are adjacent to each other between the acoustic wave resonators 140. This configuration makes the area where the wiring lines 132a and 130a face each other smaller than the area in a case where the thick wiring lines 132 are adjacent to each other. Thus, the parasitic capacitance between the wiring lines is reduced, and the characteristics such as insertion loss are improved. Additionally, the stress of the wiring line 130a is less than that of the wiring line 132a, and thus short circuit of the wiring line 132 due to the stress of the wiring line 132 is prevented. Furthermore, the electrostatic discharge failure between the wiring lines 132a and 130a is prevented. Thus, the distance D1 between the wiring lines 130a and 132a is reduced, and thereby the size of the transmit filter 200 is reduced. For example, the distance D1 can be made to be less than the film thickness T1 of the wiring line 130a.

As described later, when the thick wiring line 132a is formed by plating and the distance between the thick wiring lines 132a is short, a resist pattern, which is a mask for plating, may not be properly formed. In this case, short circuit between the wiring lines occurs, or a resistor may be left on the substrate 10, and concerns on reliability may remain. In the second embodiment, the one of the adjacent wiring lines 130a and 132a is the thin wiring line 130a, and thus a resist pattern is properly formed.

When an aspect ratio T2/D1 of the film thickness T2 of the wiring line 132a to the distance D1 is greater than two, the resist pattern is more likely not to be formed properly. Accordingly, T2/D1 is preferably two or less. To reduce the size, T2/D1 is preferably 0.025 or greater.

The wiring line 132a directly connecting to the pad 134 including the bump 136 is preferably thickened among the adjacent wiring lines 130a and 132a. Additionally, the wiring line 130a that is not directly connected to the pad 134 including the bump 136 is preferably thinned. The bump 136 is bonded to, for example, a module substrate. The heat generated in the acoustic wave device is released to the module substrate through the bump 136. The thick wiring line 132 has a thermal conductivity better than that of the thin wiring line 130. Thus, thickening the wiring line 132a directly connecting to the pad 134 allows the heat to be released efficiently. The pad 134 corresponding to the ground terminal GND has good heat release performance through the module substrate. Thus, the pad 134 to which the wiring line 132a is directly connected is preferably a pad corresponding to the ground terminal GND.

Figure 10:
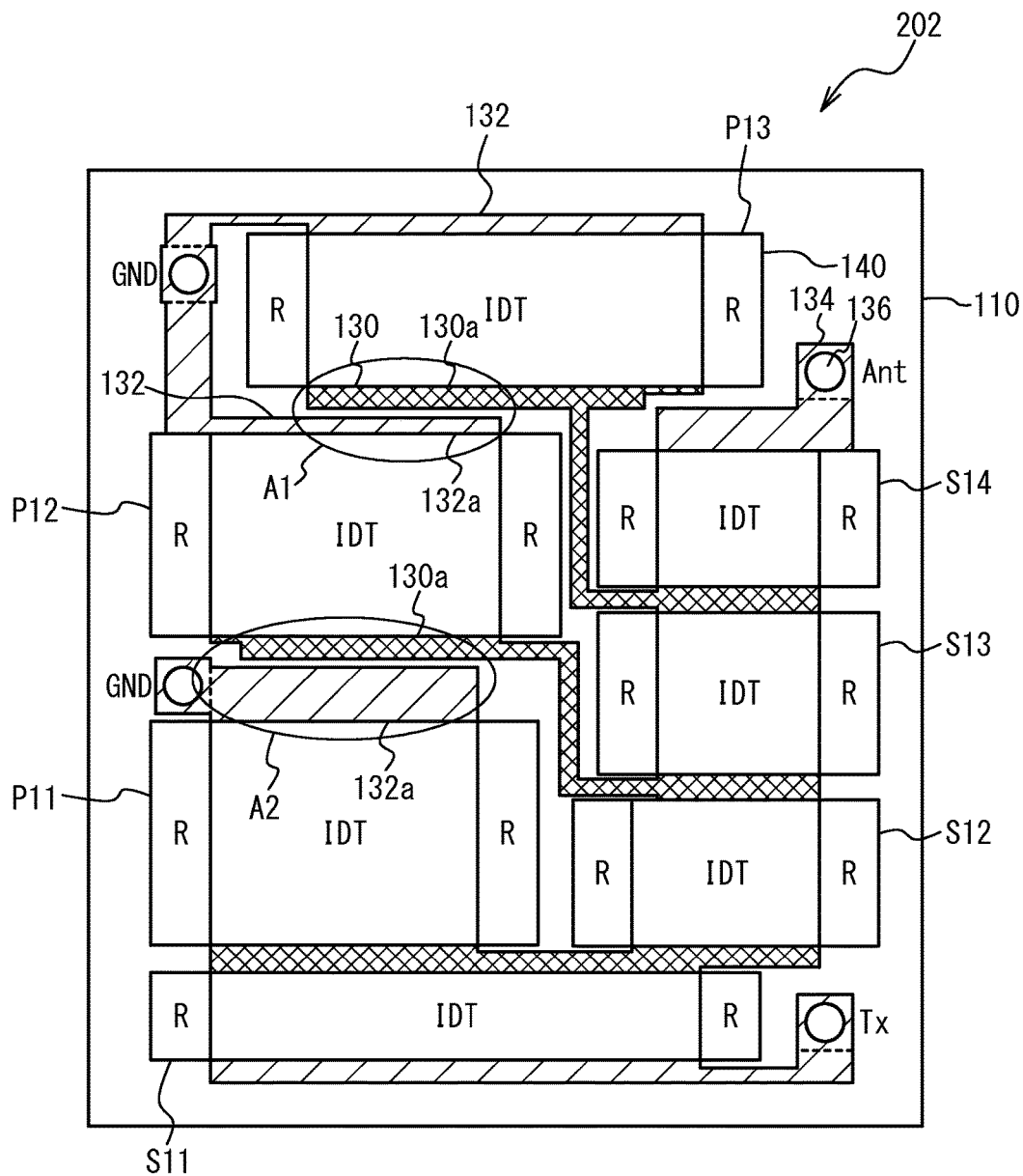
FIG. 10 is a plan view of an acoustic wave device in accordance with a first variation of the second embodiment.

FIG. 10 is a plan view of an acoustic wave device in accordance with a first variation of the first embodiment. As illustrated in FIG. 10, in a transmit filter 202, wiring lines directly connected to the pads 134 including the bump 136 are the thick wiring lines 132, and wiring lines that are not directly connected to the bumps 136 are the thin wiring lines 130 as well as those in the regions A1 and A2. For example, the wiring lines interconnecting the acoustic wave resonators 140 are the thin wiring lines 130. Other structures are the same as those of the second embodiment, and thus the description is omitted. The first variation of the second embodiment also efficiently releases heat from the bump 136.

As with in the second embodiment, the wiring line that is not directly connected to the pad 134 may be the thin wiring line 130, and other wiring lines may be the thick wiring line 132 only in the regions A1 and A2 where the wiring lines with different electric potentials are adjacent to each other. This configuration can improve heat release performance and power durability because the wiring lines insulated from the influence of the parasitic capacitance can be thickened. Additionally, the thin wiring line 130 may be provided in a region other than the regions A1 and A2 as with in the first variation of the second embodiment. As described above, in the regions A1 and A2 where the wiring lines having different electric potentials are adjacent to each other, one of the adjacent wiring lines is required to be thinner than the other.

Figure 11:
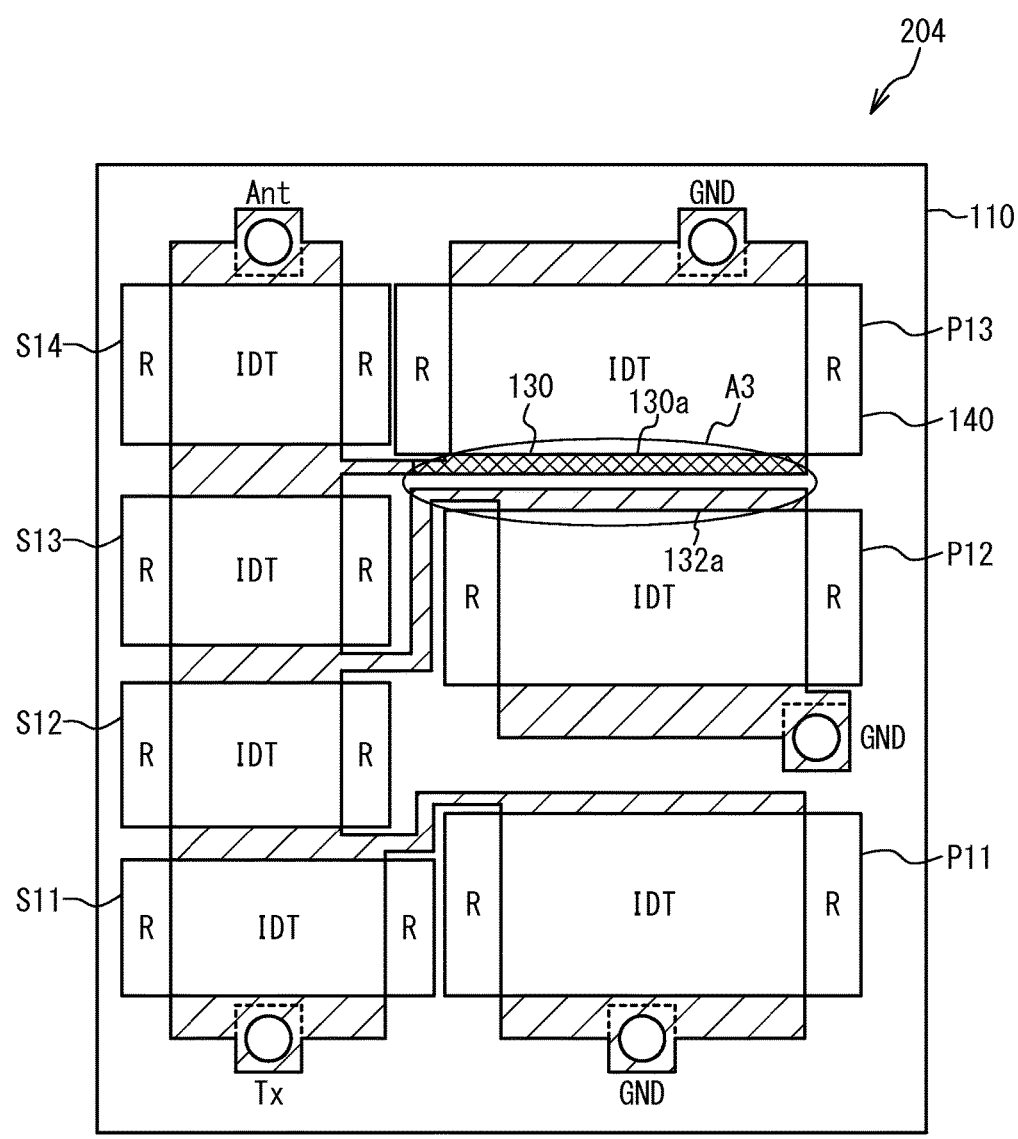
FIG. 11 is a plan view of an acoustic wave device in accordance with a second variation of the second embodiment.

FIG. 11 is a plan view of an acoustic wave device in accordance with a second variation of the second embodiment. In a transmit filter 204, the wiring lines 130a and 132a are adjacent to each other between the parallel resonators P12 and P13 in a region A3. The wiring line 130a is connected to a node between the series resonators S13 and S14. The wiring line 132a is connected between the series resonators S12 and S13. The wiring lines 130a and 132a are not directly connected to the pad 134. Other structures are the same as those of the second embodiment, and thus the description is omitted.

In the second variation of the second embodiment, the wiring line 132a is located closer to the pad 134 corresponding to the transmit terminal Tx (the pad to which a signal is input) than the wiring line 130a is. The resonator located closer to the pad 134 corresponding to the transmit terminal Tx generates more heat than the resonator located far from the pad 134. Thus, the wiring line located closer to the input pad 134 is made to be the thick wiring line 132. This configuration allows for efficient heat release.

In the second embodiment and its variations, the extension directions of the wiring lines 130a and 132a are parallel to each other as illustrated in FIG. 8. When the parallel wiring lines are adjacent to each other, the increase in parasitic capacitance between the wiring lines, short circuit between the wiring lines, and/or electrostatic discharge failure between the wiring lines easily occurs. Thus, the wiring line 132a is made to be thicker than the wiring line 130a. This reduces the distance between the wiring lines, thereby reducing the size of the acoustic wave device.

The wiring lines 130a is electrically coupled to the bus bar 146 of the parallel resonator P13 (first acoustic wave resonator) and the wiring line 132a is electrically coupled to the bus bar 146 of the parallel resonator P12 (second acoustic wave resonator). The extension directions of the wiring lines 130a and 132a are parallel to the extension direction of the bus bar 146. When the acoustic wave resonator 140 includes the bus bar 146, the length along which the wiring lines 130a and 132a face each other is long. When the length along which the wiring lines face each other is long, the increase in parasitic capacitance between the wiring lines, short circuit between the wiring lines, and/or electrostatic discharge failure between the wiring lines easily occurs. Thus, the wiring line 132a is made to be thicker than the wiring line 130a. This reduces the distance between the wiring lines, thereby reducing the size of the acoustic wave device.

When the adjacent resonators are parallel resonators, the wiring lines facing each other have different electric potentials. Thus, the increase in parasitic capacitance between the wiring lines, short circuit between the wiring lines, and/or electrostatic discharge failure between the wiring lines easily occurs. Thus, the wiring line 132a is made to be thicker than the wiring line 130a. This reduces the distance between the wiring lines, thereby reducing the size of the acoustic wave device.

Third Embodiment

Figure 12:
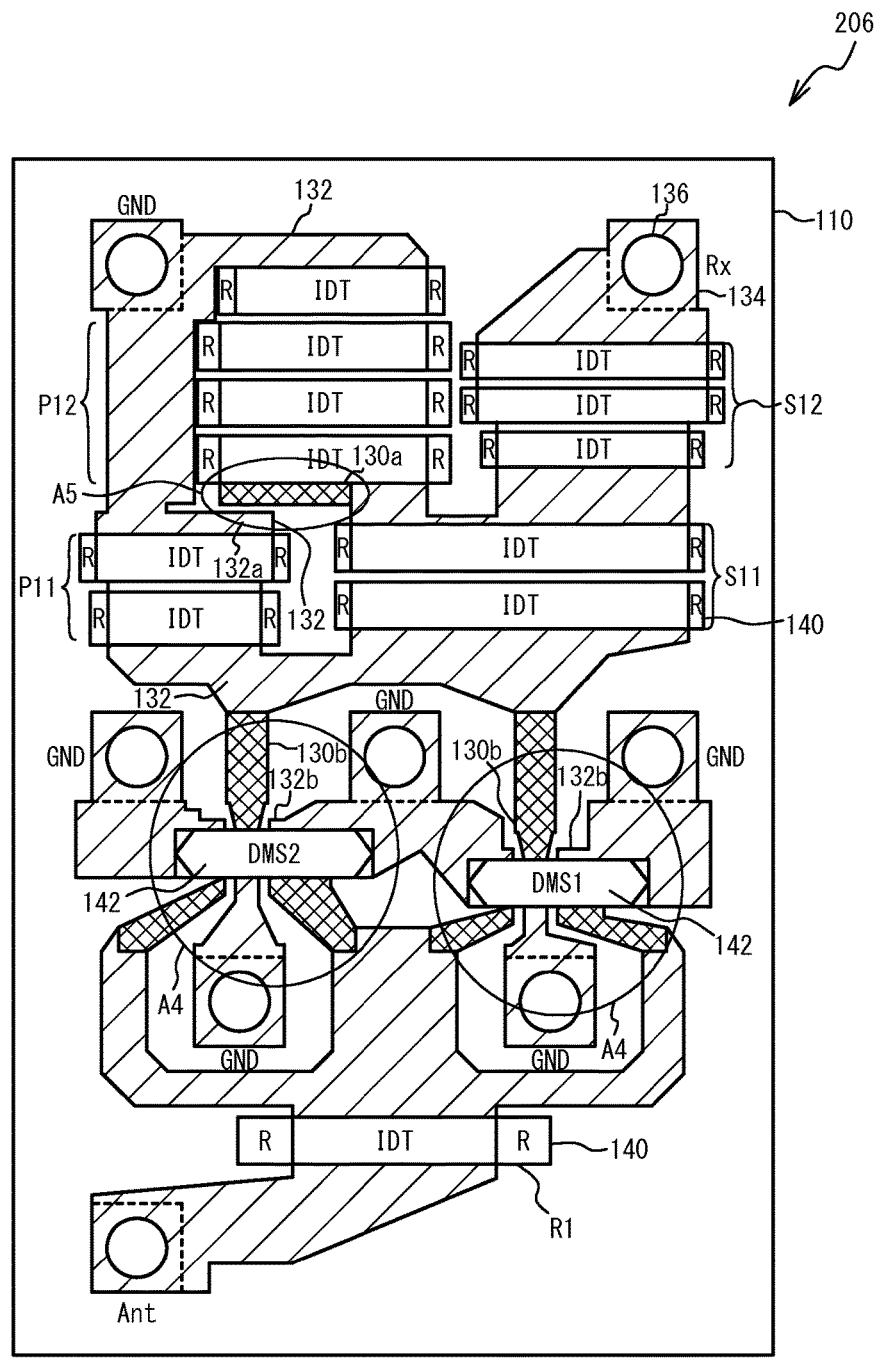
FIG. 12 is a plan view of an acoustic wave device in accordance with a third embodiment.

A third embodiment describes a case where an acoustic wave device is the receive filter 172 of FIG. 6. FIG. 12 is a plan view of an acoustic wave device in accordance with the third embodiment. As illustrated in FIG. 12, a receive filter 206 includes the acoustic wave resonators 140 and multi-mode acoustic wave filters 142 formed on the substrate 110. The multi-mode acoustic wave filters 142 are double-mode surface acoustic wave filters DMS1 and DMS2. The DMS1 and DMS2 are connected in parallel. The input terminals of the DMS1 and DMS2 are coupled to the antenna terminal Ant through a resonator R1. The grounds of the DMS1 and DMS2 are coupled to the ground terminals GND. The series resonators S11 and S12 are connected in series and the parallel resonators P11 and P12 are connected in parallel between the output terminals of the DMS1 and DMS2 and the receive terminal Rx. The series resonator S11 is divided into two, and the series resonator S12 is divided into three. The parallel resonator P11 is divided into two, and the parallel resonator P12 is divided into four.

In regions A4, wiring lines 132b and 130b are adjacent to each other between the resonator R1 and the DMS1, between the resonator R1 and the DMS2, between the DMS1 and the series resonator S11, and between the DMS2 and the parallel resonator P11. The wiring line through which a signal is transmitted from the antenna terminal Ant to the receive terminal Rx is the thin wiring line 130b. The wiring line directly connected to the ground terminal GND is the thick wiring line 132b. In a region A5, the wiring lines 130a and 132a are adjacent to each other between the parallel resonators P11 and P12. The thick wiring line 132a is directly connected to the pad 134 including the bump 136. The thin wiring line 130a is not directly connected to the pad 134 including the bump 136. Other structures are the same as those of the second embodiment, and thus the description is omitted.

In the third embodiment, the wiring lines 130b are electrically coupled to the input terminal and the output terminal (i.e., signal terminals) of the multi-mode acoustic wave filters 142, and the wiring lines 132b are electrically coupled to the ground terminals of the multi-mode acoustic wave filters 142. The signal terminal and the ground terminal of the multi-mode acoustic wave filter 142 are adjacent to each other. Thus, the wiring line 132a is made to be thicker than the wiring line 130a. This reduces the distance between the wiring lines, thereby reducing the size of the acoustic wave device.

Figure 13:
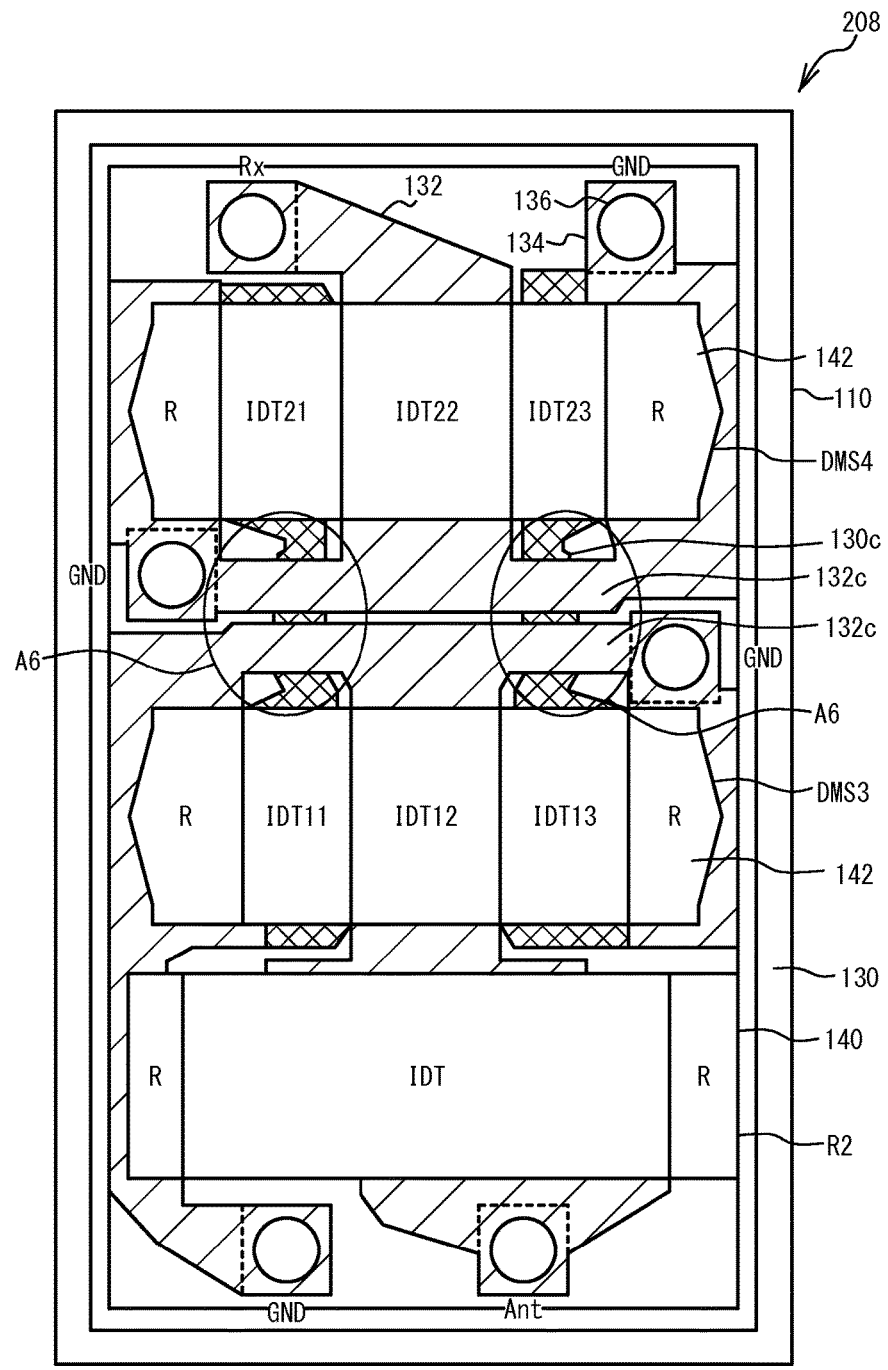
FIG. 13 is a plan view of an acoustic wave device in accordance with a first variation of the third embodiment.

FIG. 13 is a plan view of an acoustic wave device in accordance with a first variation of the third embodiment. As illustrated in FIG. 13, in a receive filter 208, a resonator R2, a DMS3, and a DMS4 are connected in series between the antenna terminal Ant and the receive terminal Rx. The DMS3 includes IDT11 through IDT13 and reflectors R. The IDT11 through IDT13 are arranged in the propagation direction of the acoustic wave. The DMS4 includes IDT21 through IDT23 and reflectors R.

A first end of the IDT12 of the DMS3 is coupled to the antenna terminal Ant through the resonator R2. A second end of the IDT12 is coupled to the ground terminal GND. First ends of the IDT11 and IDT13 are coupled to the ground terminal GND. A second end of the IDT11 is coupled to a first end of the IDT21 of the DMS4 through the wiring line 130c, and a second end of the IDT13 is coupled to a first end of the IDT23 of the DMS4 through the wiring line 130c. Second ends of the IDT21 and IDT23 are coupled to the ground terminal. A first end of the IDT22 is coupled to the ground terminal. A second end of the IDT22 is coupled to the receive terminal Rx. Other structures are the same as those of the third embodiment, and thus the description is omitted.

In regions A6, the wiring lines 130c and 132c are adjacent to each other between the DMS3 and the DMS4. The wiring line 132c crosses over the wiring line 130c. A dielectric layer is located between the wiring lines 130c and 132c. An air gap may be located between the wiring lines 130c and 132c. The wiring line 132c is directly connected to the pad 134 including the bump 136. The wiring line 130c is not directly connected to the pad 134. The size of the acoustic wave device can be reduced by crossing the thin wiring line 130c and the thick wiring line 132c, as described above. To easily cross two wiring lines, a part of the thick wiring line 132c preferably crosses over the thin wiring line 130c.

When the signal terminal of the DMS3 (first multi-mode acoustic wave filter) is connected to the signal terminal of the DMS4 (second multi-mode acoustic wave filter), the size of the acoustic wave device can be reduced by crossing the wiring line interconnecting the signal terminals and the ground wiring line. Thus, the wiring line 130c preferably connects the signal terminal of the DMS3 to the signal terminal of the DMS4, and the wiring line 132c is preferably connected to the ground terminal of at least one of the DMS3 and the DMS4.

At least one of the transmit filter 170 and the receive filter 172 of the duplexer illustrated in FIG. 6 can use the transmit filter in accordance with any one of the second embodiment and its variations and the receive filter in accordance with any one of the third embodiment and its variations.

Figure 14A:
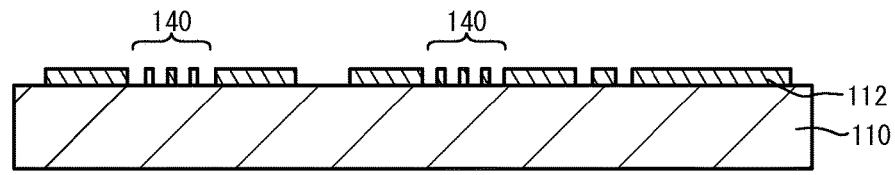
FIG. 14A through FIG. 14D are cross-sectional views illustrating a method of fabricating the acoustic wave device of the second and third embodiments and their variations (No. 1)

FIG. 14A through FIG. 15D are cross-sectional views illustrating a method of fabricating the acoustic wave device in accordance with the second and third embodiments and their variations. As illustrated in FIG. 14A, the metal film 112 is formed on the substrate 110. The substrate 110 is, for example, a piezoelectric substrate such as a lithium tantalate substrate or a lithium niobate substrate. The metal film 112 is, for example, an aluminum film or a titanium film. The metal film 112 is formed by, for example, sputtering and etching. The metal film 112 forms the acoustic wave resonators 140. The metal film 112 has a film thickness of, for example, 100 to 500 nm. The metal film 112 may be a copper film or a gold film. The metal film 112 forms the lowermost layers 115 of the wiring lines 130 and 132 and the wiring lines 130c.

Figure 14B:
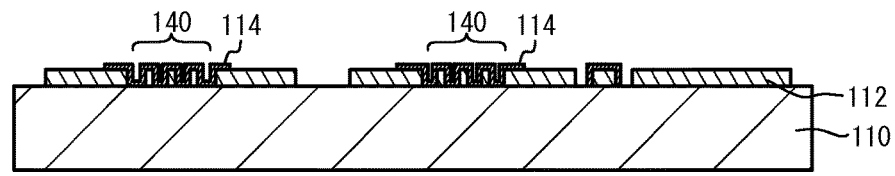
Figure 14C:
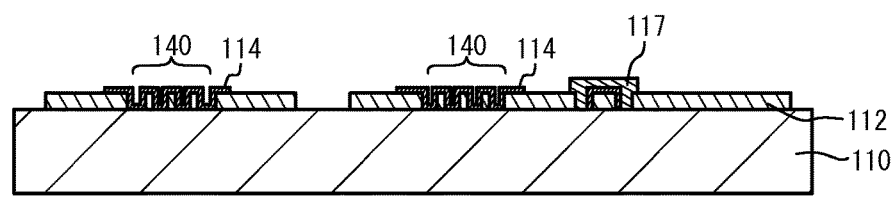

As illustrated in FIG. 14B, a protective film 114 is formed on the acoustic wave resonators 140 and the wiring lines 130c. The protective film 114 is, for example, a silicon oxide film with a film thickness of 20 nm. The protective film 114 is formed by, for example, sputtering and etching. As illustrated in FIG. 14C, a dielectric film 117 is formed to cover the wiring line 130c. The dielectric film 117 is, for example, an insulating material such as a resin.

Figure 14D:
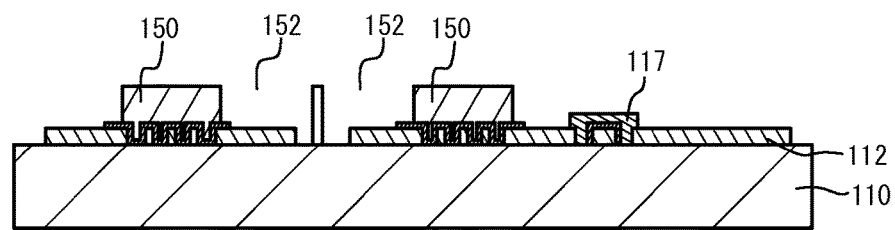

As illustrated in FIG. 14D, a mask layer 150 is formed on the substrate 110 to form apertures 152 in regions where the wiring line 132 and the wiring line 130a are formed. The mask layer 150 is, for example, a photoresist, and is formed by photolithography. The film thickness of the mask layer 150 is set so that the desired resolution can be obtained in photolithography, and is preferably 2 µm or greater because a seed layer 116 is liftoff as described later. The mask layer 150 preferably has a heat resistance withstanding the temperature during bake conducted later.

Figure 15A:
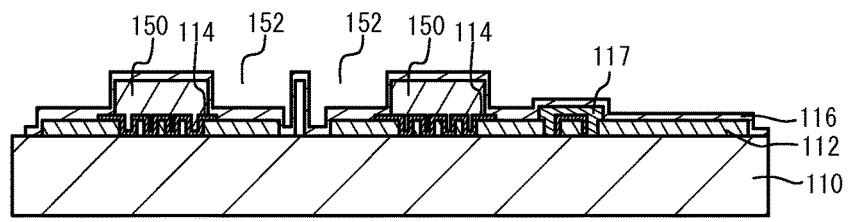
FIG. 15A through FIG. 15D are cross-sectional views illustrating the method of fabricating the acoustic wave device of the second and third embodiments and their variations (No. 2).

As illustrated in FIG. 15A, the seed layer 116 is formed across the entire surface on the substrate 110 to cover the mask layer 150. The seed layer 116 is, for example, a titanium film with a film thickness of 0.2 µm and a gold film with a film thickness of 0.15 µm stacked in this order from the substrate 110 side. The seed layer 116 is formed by, for example, evaporation. The seed layer 116 may be a titanium film with a film thickness of 0.1 µm and a copper film with a film thickness of 0.3 µm stacked in this order from the substrate 110 side. The seed layer 116 may be formed by sputtering, but is preferably formed by evaporation because liftoff is conducted later. The film at the substrate 110 side of the seed layer 116 is an adhesion film improving the adhesiveness to the metal film 112 and a barrier layer. When the metal film 112 is an aluminum film, the adhesion film is, for example, a titanium film. The upper film of the seed layer 116 acts as a seed for plating, and is preferably made of a material same as that of the plated layer.

Figure 15B:
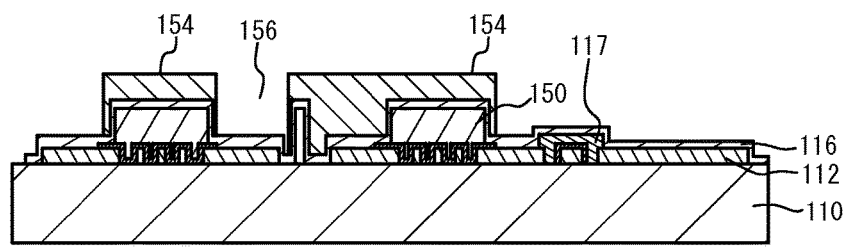

As illustrated in FIG. 15B, the mask layer 154 is formed on the seed layer 116 to form an aperture 156 in a region where the wiring line 132 is formed. The mask layer 154 is formed on the seed layer 116 to be the wiring line 130a. The mask layer 154 is, for example, a photoresist film with a film thickness of 7 µm, and is formed by photolithography. The film thickness of the mask layer 154 is set to cover the level difference of the seed layer 116 and to be greater than that of a plated layer 122, and is, for example, 5 to 20 µm.

Figure 15C:
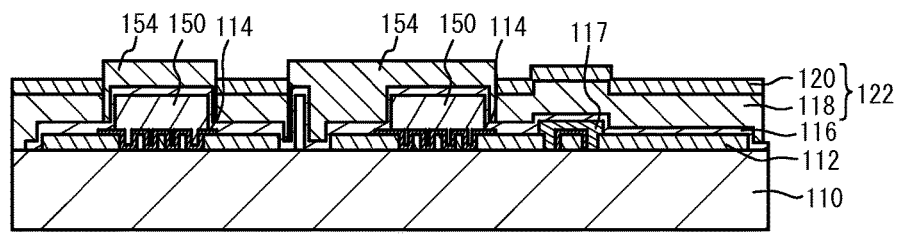

As illustrated in FIG. 15C, the plated layer 122 is formed in the aperture 156. The plated layer 122 includes the lower layer 118, a barrier layer (not illustrated), and the upper layer 120 in this order from the substrate side. The lower layer 118 is, for example, a copper layer with a film thickness of 3 µm. The barrier layer is, for example, a palladium layer with a film thickness of 0.3 µm. The upper layer 120 is, for example, a gold layer with a film thickness of 1 µm. The plated layer 122 is formed by electrolytic plating with supplying electrical current from the seed layer 116. The lower layer 118 is preferably made of a non-magnetic material of low electric resistivity capable of being thickened. Thus, the lower layer 118 is preferably a copper layer or a gold layer. The lower layer 118 preferably has a film thickness of 1 µm or greater to reduce the resistances of the wiring lines 130 and 132. When stud bumps are formed on the plated layer 122, the upper layer 120 is preferably a gold layer. The barrier layer prevents interdiffusion between the lower layer 118 and the upper layer 120 due to heating or aging. When the lower layer 118 is a copper layer and the upper layer 120 is a gold layer, the barrier layer is preferably a palladium layer or a nickel layer with a film thickness of approximately 0.2 µm. The upper layer 120 may be formed by electroless plating. In this case, the upper layer 120 has a film thickness of, for example, 0.4 µm. Alternatively, the barrier layer and the upper layer 120 may be formed by evaporation. In this case, the barrier layer is, for example, a titanium layer with a film thickness of 0.2 µm, and the upper layer 120 is a gold layer with a film thickness of 0.4 µm.

Figure 15D:
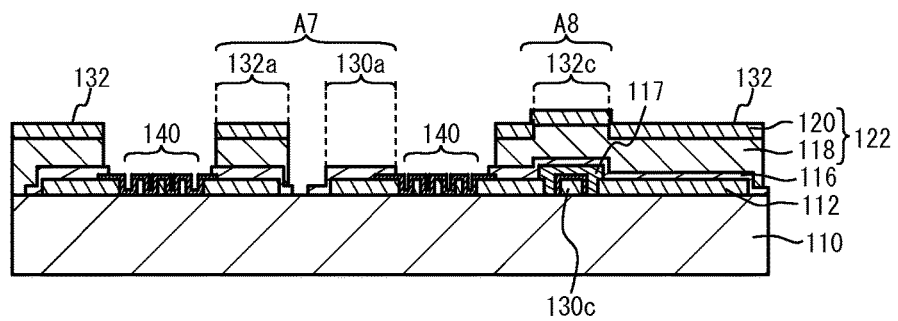

As illustrated in FIG. 15D, the mask layers 150 and 154 are removed with, for example, an organic solvent. At this time, the seed layer 116 formed between the mask layers 150 and 154 is liftoff. To liftoff the seed layer 116, the organic solvent may be jetted with high pressure. Alternatively, ultrasonic cleaning in the organic solvent may be conducted. This process allows the wiring lines 132 and 132a to be formed from the metal film 112, the seed layer 116, and the plated layer 122. The wiring line 132c is formed from the seed layer 116 and the plated layer 122. The wiring line 130a is formed from the metal film 112 and the seed layer 116. The wiring line 130c is formed from the metal film 112. In a region A7, the thick wiring line 132a and the thin wiring line 130a are formed. In a region A8, the thin wiring line p130c and the thick wiring line 132c are formed.

As illustrated in FIG. 14A, the metal film 112 is formed in regions to be the acoustic wave resonators 140, and the wiring lines 130a, 130c, 132, and 132a on the substrate 110. As illustrated in FIG. 14B, the mask layer 150 (first mask layer) is formed so that the apertures 152 (first aperture) are formed above the metal film 112 in regions to be the wiring lines 130a, 132, 132a, and 132c and the aperture 152 is not formed in a region to be the wiring line 130c. As illustrated in FIG. 15A, the seed layer 116 is formed to make contact with the metal film 112 in the aperture 152 and cover the mask layer 150. As illustrated in FIG. 15B, the mask layer 154 (second mask layer) is formed on the seed layer 116 so that the regions to be the wiring lines 132, 132a, and 132c become the apertures 156 (second aperture). As illustrated in FIG. 15C, the plated layer 122 is formed on the seed layer 116 in the aperture 156 by supplying electrical current from the seed layer 116. As illustrated in FIG. 15D, the mask layer 150 and the mask layer 154 are removed to liftoff the seed layer 116 except the seed layer 116 in the aperture 152. This process enables to form the thin wiring lines 130a and 130c and the thick wiring lines 132, 132a, and 132c.

The first through third embodiments and their variations describe the surface acoustic wave resonator as an example of the acoustic wave resonator. However, the acoustic wave resonator may be a boundary acoustic wave resonator, a Love wave resonator, or a piezoelectric thin film resonator. Additionally, the transmit filter using a ladder-type filter and the receive filter using a DMS filter have been described as examples of the acoustic wave device, but the acoustic wave device may be other acoustic wave devices.

Although the embodiments of the present invention have been described in detail, it is to be understood that the various change, substitutions, and alterations could be made hereto without departing from the spirit and scope of the invention.

What is claimed is:
1. An acoustic wave device, comprising:
a substrate;
a first acoustic wave resonator and a second acoustic wave resonator located on the substrate;
a first wiring line electrically coupled to the first acoustic wave resonator, located on the substrate, and located between the first acoustic wave resonator and the second acoustic wave resonator; and
a second wiring line electrically coupled to the second acoustic wave resonator, located on the substrate, located between the first acoustic wave resonator and the second acoustic wave resonator, having an electric potential different from an electric potential of the first wiring line, and having a thickness greater than a thickness of the first wiring line,
wherein
the second wiring line is located closer to an input pad to which a signal is input than the first wiring line is, and
the first acoustic wave resonator and the second acoustic wave resonator are connected to the input pad on the substrate.

2. The acoustic wave device according to claim 1, wherein extension directions of the first wiring line and the second wiring line are parallel to each other.

3. The acoustic wave device according to claim 2, wherein
each of the first acoustic wave resonator and the second acoustic wave resonator includes a first bus bar and a second bus bar,
the first wiring line is electrically coupled to the first bus bar of the first acoustic wave resonator, and the second wiring line is electrically coupled to the second bus bar of the second acoustic wave resonator, and
extension directions of the first wiring line and the second wiring line are parallel to extension directions of the first bus bar and the second bus bar.

4. An acoustic wave device, comprising
a substrate;
a first acoustic wave resonator and a second acoustic wave resonator located on the substrate;
a first wiring line electrically coupled to the first acoustic wave resonator, located on the substrate, and located between the first acoustic wave resonator and the second acoustic wave resonator; and
a second wiring line electrically coupled to the second acoustic wave resonator, located on the substrate, located between the first acoustic wave resonator and the second acoustic wave resonator, having an electric potential different from an electric potential of the first wiring line, and having a thickness greater than a thickness of the first wiring line,
wherein:
the second wiring line is directly connected to a pad including a bump,
the first wiring line is not directly connected to a pad including a bump,
no pad is located between the first acoustic wave resonator and the second acoustic wave resonator, and
extension directions of the first wiring line and the second wiring line are parallel to each other.

5. The acoustic wave device according to claim 4, wherein
each of the first acoustic wave resonator and the second acoustic wave resonator includes a first bus bar and a second bus bar,
the first wiring line is electrically coupled to the first bus bar of the first acoustic wave resonator, and the second wiring line is electrically coupled to the second bus bar of the second acoustic wave resonator, and
extension directions of the first wiring line and the second wiring line are parallel to extension directions of the first bus bar and the second bus bar.

6. An acoustic wave device, comprising:
a substrate;
one or more series resonators connected in series between an input terminal and an output terminal;
parallel resonators connected in parallel between the input terminal and the output terminal;
a first acoustic wave resonator and a second acoustic wave resonator located on the substrate;
a first wiring line electrically coupled to the first acoustic wave resonator, located on the substrate, and located between the first acoustic wave resonator and the second acoustic wave resonator; and
a second wiring line electrically coupled to the second acoustic wave resonator, located on the substrate, located between the first acoustic wave resonator and the second acoustic wave resonator, having an electric potential different from an electric potential of the first wiring line, and having a thickness greater than a thickness of the first wiring line,
wherein
extension directions of the first wiring line and the second wiring line are parallel to each other,
each of the first acoustic wave resonator and the second acoustic wave resonator includes a first bus bar and a second bus bar,
the first wiring line is electrically coupled to the first bus bar of the first acoustic wave resonator, and the second wiring line is electrically coupled to the second bus bar of the second acoustic wave resonator,
extension directions of the first wiring line and the second wiring line are parallel to extension directions of the first bus bar and the second bus bar, and
the parallel resonators include the first acoustic wave resonator and the second acoustic wave resonator.

* * * * *